(12) United States Patent
Goko

(10) Patent No.: US 6,437,632 B1
(45) Date of Patent: *Aug. 20, 2002

(54) SIGNAL SELECTING CIRCUIT

(75) Inventor: Yuki Goko, Miyagi (JP)

(73) Assignee: NEC Corporation, Tokyo (JP)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/579,143

(22) Filed: May 30, 2000

(30) Foreign Application Priority Data

Jun. 3, 1999 (JP) .......................................... 11-157112

(51) Int. Cl.[7] .............................. H04J 3/02; H04Q 3/52
(52) U.S. Cl. ........................ 327/403; 327/565; 327/407
(58) Field of Search ................................ 327/403, 407, 327/99, 408, 416, 564, 565; 333/103

(56) References Cited

U.S. PATENT DOCUMENTS

| | | | |
|---|---|---|---|
| 5,047,760 A | * | 9/1991 | Hofmann ..................... 327/403 |
| 5,412,380 A | * | 5/1995 | Matsuda et al. ........ 340/825.85 |
| 5,420,534 A | * | 5/1995 | Elabd ......................... 327/403 |

FOREIGN PATENT DOCUMENTS

| | | |
|---|---|---|
| JP | 4-343258 | 11/1992 |
| JP | 9-252240 | 9/1997 |

* cited by examiner

Primary Examiner—Dinh T. Le
(74) Attorney, Agent, or Firm—McGinn & Gibb, PLLC

(57) ABSTRACT

A signal selection circuit, which has a resistant characteristic to crosstalk noise among signals and can output inputted signals without having the deterioration of the duty ratio of the inputted signals, is provided. The signal selection circuit, in which one signal is selected from plural inputted signals and the selected one signal is outputted, provides plural select circuit blocks, which are disposed in a matrix state, for choosing whether each inputted signal is made to transmit or cut off, and input lines, which are wired to one direction, for making the plural inputted signals input to the plural select circuit blocks, and output lines, which are wired to the cross direction to the input lines, for making outputted signals from the plural select circuit blocks output. And the input lines and the output lines are disposed between wiring biased by a constant voltage. And the plural select circuit blocks are surrounded with wiring biased by a constant voltage. And further the plural select circuit blocks are composed of circuits which inverse the logic of signal, and the input lines and the output lines also provide circuits which inverse the logic of signal.

10 Claims, 3 Drawing Sheets

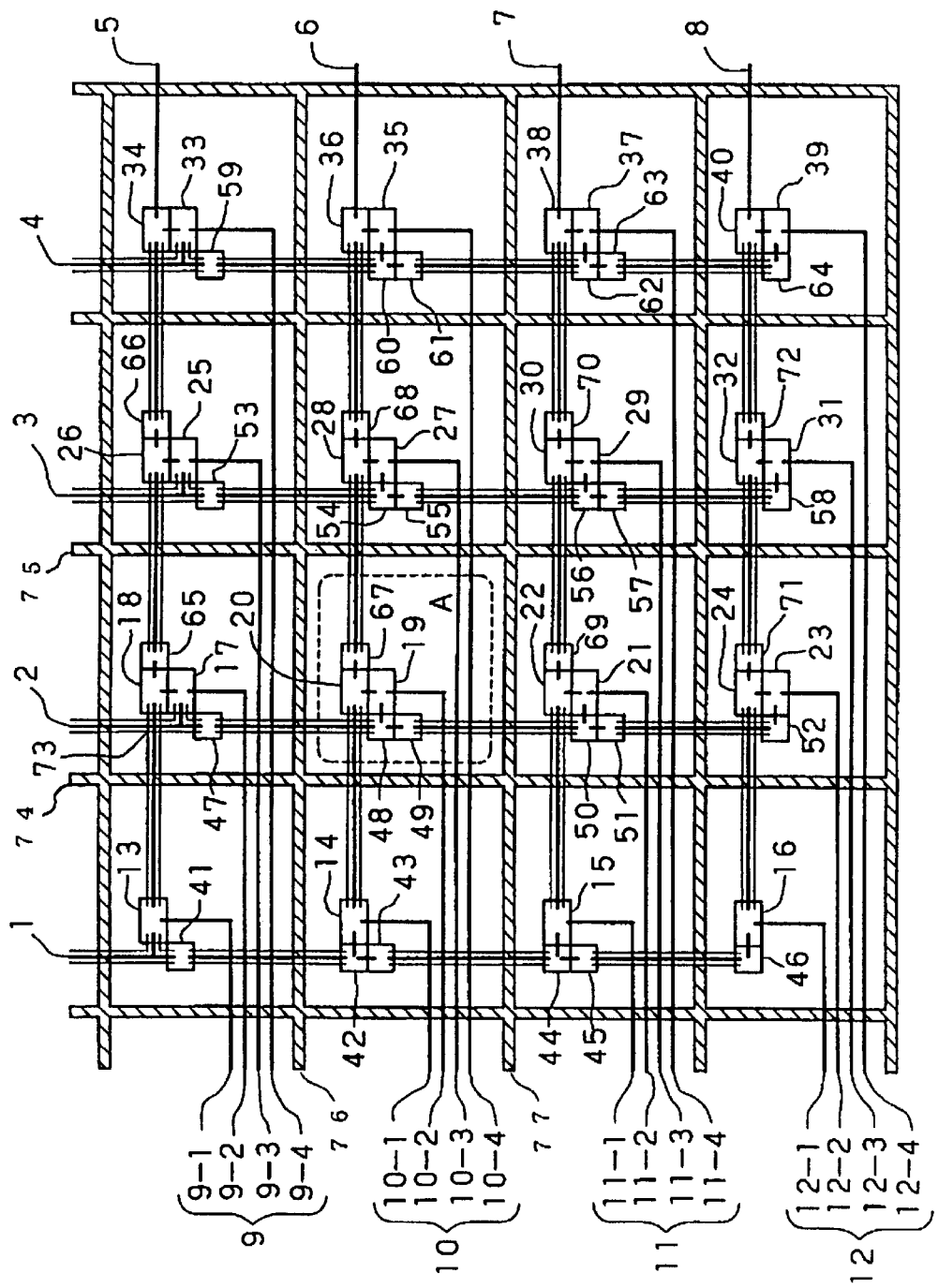

SIGNAL SELECTING CIRCUIT

BACKGROUND OF THE INVENTION

The present invention relates to a signal selection circuit, which is built in a large scale integrated circuit (LSI), selects an arbitrary signal from plural inputted signals and outputs the selected arbitrary signal to an arbitrary output terminal.

Description of the Related Art

Wiring and disposing components in a LSI have been automatically designed by using a computer aided design (CAD) system. FIG. 1 is a circuit diagram showing a conventional signal selection circuit in a LSI. As shown in FIG. 1, the conventional signal selection circuit consists of four input terminals 1 to 4, four output terminals 5 to 8, four selection control terminals 9 to 12, four decoding circuits (DECs) 79, and twelve 2-1 selectors 78. The DECs 79 decode control signals from the selection control terminals 9 to 12 and generate control signals to control the 2-1 selectors 78. When the wiring and disposing components are designed by this circuit diagram, signals inputted from the input terminals 1 to 4 are transmitted in parallel to two input terminals of the 2-1 selectors 78 in an active state.

Recently, the LSI has become further large scale and high speed. With this, the number and the length of parallel wiring have increased, and the distance of parallel wiring has become long. Consequently, there are problems that crosstalk noise is generated and the duty ratio of signals is deteriorated. At this conventional signal selection circuit shown in FIG. 1, two active signals are transmitted in parallel, therefore, the crosstalk noise can be generated. And the signal is transmitted by single logic, that is, positive logic or negative logic, therefore, in case that a delay occurs only at either one of rise time and fall time, there is a problem that the duty ratio of the signal is changed.

SUMMARY OF THE INVENTION

It is therefore an object of the present invention to provide a signal selection circuit, in which a resistant characteristic to crosstalk noise among signals can be achieved, and signals can be outputted without having the deterioration of the duty ratio of input signals, in a LSI that makes arbitrary input signals output to arbitrary output terminals by using control signals.

According to a first aspect of the present invention, for achieving the object mentioned above, there is provided a signal selection circuit, in which one signal is selected from plural inputted signals and the selected one signal is outputted. Said signal selection circuit provides plural select circuit blocks, which are disposed in a matrix state, for choosing whether each inputted signal is made to transmit or cut off, and input lines, which are wired to one direction, for making said plural inputted signals input to said plural select circuit blocks, and output lines, which are wired to the cross direction to said input lines, for making outputted signals from said plural select circuit blocks output.

According to a second aspect of the present invention, in the first aspect, said input lines and said output lines are disposed between wiring biased by a constant voltage.

According to a third aspect of the present invention, in the first aspect, said plural select circuit blocks are surrounded with wiring biased by a constant voltage.

According to a fourth aspect of the present invention, in the first aspect, said plural select circuit blocks are composed of circuits which inverse the logic of signal, and said input lines and said output lines also provide circuits which inverse the logic of signal.

According to the present invention, when one inputted signal from one input terminal is transmitted to one output terminal, the other inputted signals not selected can be inhibited by using control signals. Therefore, a resistant characteristic to crosstalk noise for the signal transmitting to said output terminal can be achieved. And said input terminals and said output terminals are not disposed in parallel, therefore, parallel wiring of said signal lines being in an active state is prevented, and the resistant characteristic to crosstalk noise can be achieved.

According to the present invention, wiring biased by the ground voltage or a constant voltage of the power source voltage is disposed at the both sides being the upper and lower sides or the right and left sides of said signal lines. Therefore, the bad influence caused by the crosstalk noise to said signal lines is prevented one another, and the resistant characteristic to crosstalk noise can be achieved. And said select circuit blocks are surrounded with wiring biased by the ground voltage or a constant voltage of the power source voltage. Therefore, the bad influence caused by the crosstalk noise to said select circuit blocks is prevented one another, and the resistant characteristic to crosstalk noise can be achieved.

According to the present invention, inverting circuits composed of NAND circuits and inverter circuits are used, therefore the duty ratio can be easily adjusted. Consequently, signals can be outputted without having the deterioration of the duty ratio.

BRIEF DESCRIPTION OF THE DRAWINGS

The objects and features of the present invention will become more apparent from the consideration of the following detailed description taken in conjunction with the accompanying drawings in which:

FIG. 3 is a wiring diagram showing the signal selection circuit shown in FIG. 2 of the present invention.

DESCRIPTION OF THE PREFERRED EMBODIMENT

Figure 1:
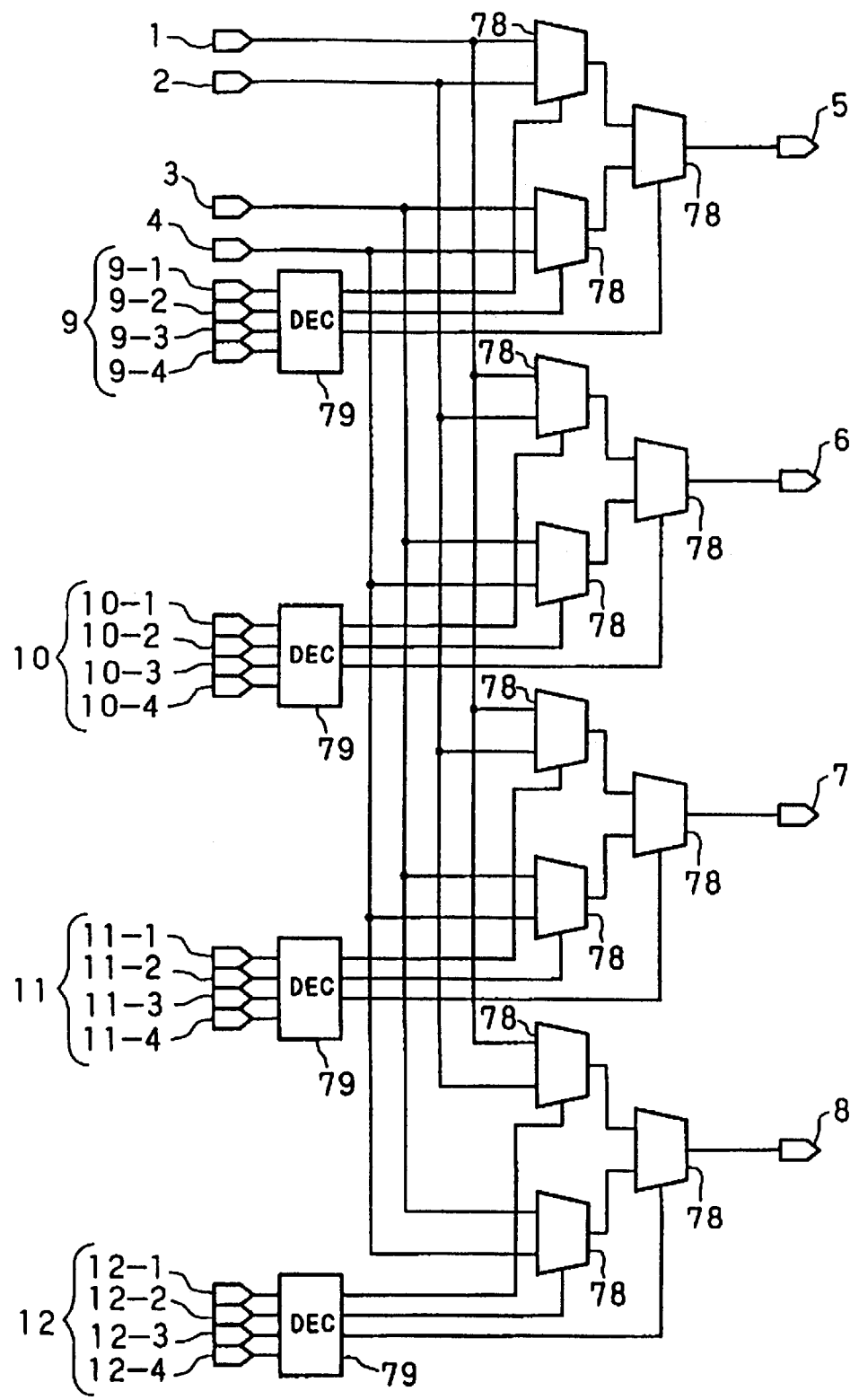
FIG. 1 is a circuit diagram showing a conventional signal selection circuit in a LSI.
Figure 2:
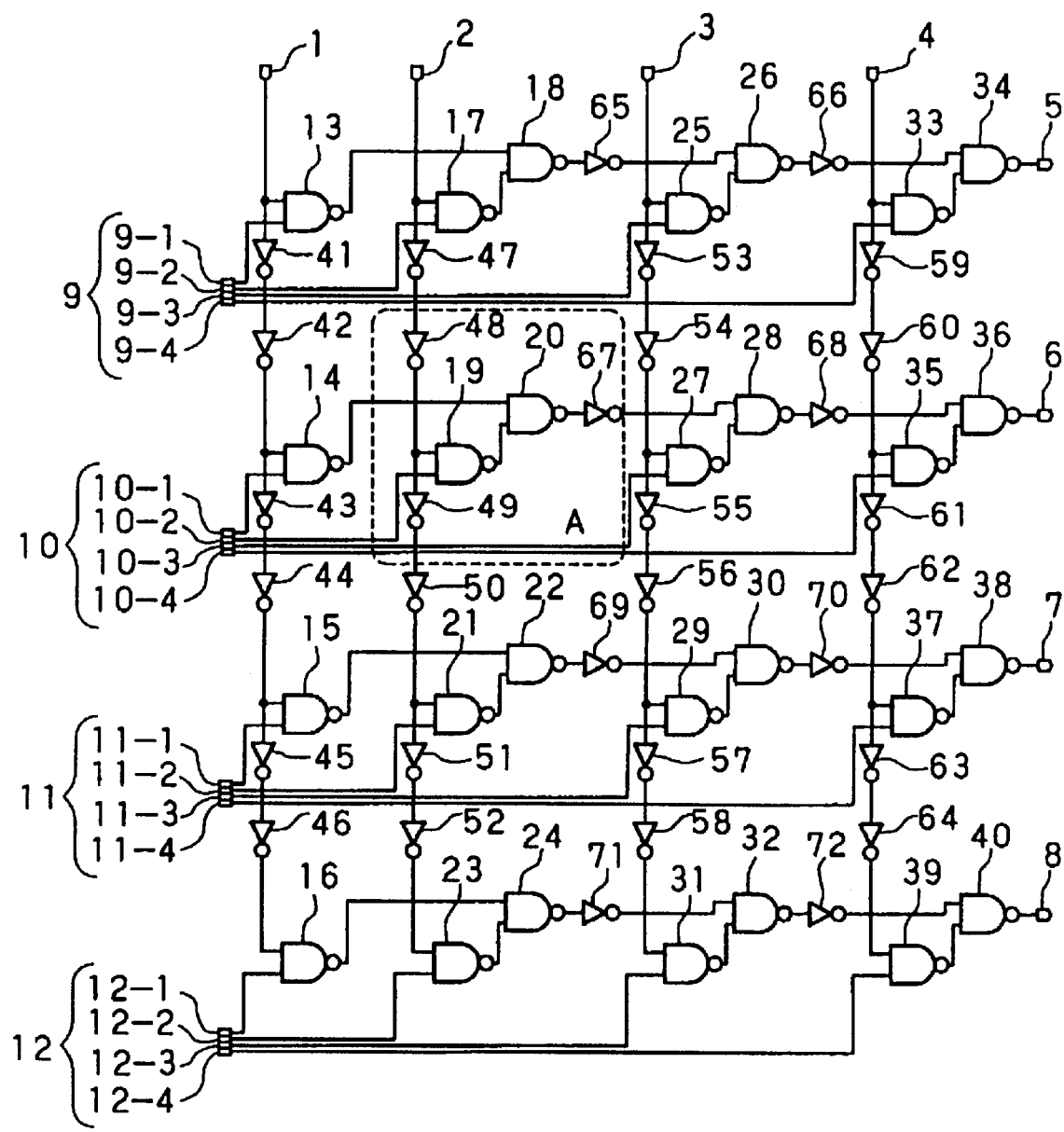
FIG. 2 is a circuit diagram showing an embodiment of a signal selection circuit in a LSI of the present invention.

Referring now to the drawings, an embodiment of the present invention is explained in detail. FIG. 2 is a circuit diagram showing an embodiment of a signal selection circuit in a LSI of the present invention. As shown in FIG. 2, the signal selection circuit of the present invention consists of four input terminals 1 to 4, four output terminal 5 to 8, four selection control terminals 9 to 12, twenty eight NAND circuits 13 to 40, and thirty two inverter circuits 41 to 72. In order to make the explanation concise, this circuit diagram only shows a part of the LSI, and the number of composed elements is not limited to the numbers shown in FIG. 2. In this signal selection circuit, an arbitrary signal from the input terminals 1 to 4 is decided by control signals from the selection control terminals 9 to 12 and the arbitrary inputted signal is outputted to some of arbitrary output terminals 5 to 8.

In FIG. 2, the NAND circuit 13 selects a signal from the input terminal 1 and outputs the selected signal to the output terminal 5, and the NAND circuit 14 selects a signal from the input terminal 1 and outputs the selected signal to the output terminal 6. And the NAND circuits 15 and 16 have the same function as the NAND circuits 13 and 14, and the NAND circuit is a circuit in which a signal inputted from a specified input terminal is transmitted to a specified output terminal.

A combination of NAND circuits 17 and 18 selects a signal from the input terminal 2 and outputs the selected signal to the output terminal 5. Combinations of NAND circuits 19 and 20 to 39 and 40 have the same function as the combination of the NAND circuits 17 and 18. And the combination of the NAND circuits is a circuit in which a signal inputted from a specified input terminal is transmitted and outputted to a specified output terminal.

The inverter circuits 41 to 72 are circuits in which the rise and fall logic of signals to be transmitted are inverted.

At this explanation, a circuit, which decides whether a signal inputted from an input terminal is made to transmit to an output terminal or not, is named a select circuit. This select circuit is the circuit, such as a block of the inverter circuit 41 and the NAND circuit 13 that selects the signal from the input terminal 1 and a block of inverter circuits 47 and 65 and the combination circuit of the NAND circuits 17 and 18 that selects the signal from the input terminal 2. And the select circuit is actually composed of one or more inverter circuits and one or two NAND circuits.

At the embodiment of the present invention, in order to strengthen the resistant characteristic to crosstalk noise, four kinds of methods are used.

First, a first method is explained. At the first method, when one signal line is selected at a select circuit, a signal not selected is inhibited. That is, for example, at the combination circuit of the NAND circuits 17 and 18, when a signal from the NAND circuit 13 is selected, a signal from the input terminal 2 is inhibited at the NAND circuit 17 and the output level from the NAND circuit 17 is fixed. And when the signal from the input terminal 2 is selected, the signal from the input terminal 1 is inhibited at the NAND circuit 13, and the output level of the NAND circuit 13 is fixed.

Further, when a signal is transmitted from the input terminal 1 to the output terminal 5, signals from the input terminal 2 to 4 are inhibited at the NAND circuits 17, 25, and 33, so that the signals from the input terminal 2 to 4 are not transmitted in an active state in parallel with a signal line from the NAND circuit 13 to the output terminal 5. As mentioned above, circuits, which inhibit a signal from each input terminal, are provided. With this, the levels of the other input terminals of the select circuits, in which the signal of the selected input terminal is transmitted, are fixed, and the signal lines, which work in an active state in parallel, are inhibited.

Next, a second method is explained. At the second method, the input terminals and the output terminals are not disposed in parallel. As shown in FIG. 2, the input terminals 1 to 4 are disposed perpendicular to the output terminals 5 to 8. The signal from each input terminal is transmitted from the upper side to the lower side, and the signals selected by the selection control signals are transmitted from the left side to the right side output terminals.

In this, a case that a signal from the input terminal 1 is transmitted to the output terminal 5 is explained. At this time, the output signal from the NAND circuit 13 and the signal from the input terminal 2, the output signal from the inverter circuit 65 and the input signal from the input terminal 3, and the output signal from the inverter circuit 66 and the input signal from the input terminal 4 are crossed one another in the active state. However, parallel wiring being a cause of crosstalk noise does not exist, therefore, the resistant characteristic to crosstalk noise is improved.

Then, a third method is that the signal line from each input terminal and the output signal lines from the select circuits are disposed between wiring biased to the ground voltage or a constant voltage of the power source voltage. FIG. 3 is a wiring diagram showing the signal selection circuit shown in FIG. 2 of the present invention. As shown in FIG. 3, a shielded wire 73 is the biased wiring mentioned above. With this wiring, the signal lines are disposed between the biased wiring being a constant voltage, therefore, noise generated at the other signal lines is cut off from the signal line and the bad influence to the signal line can be reduced. And also, noise generated at the signal line is cut off from the other signal lines and the bad influence to the other signal lines can be reduced.

Last, a fourth method is that select circuits are disposed so that the select circuits are surrounded by wiring biased to a constant voltage of the ground voltage or the power source voltage as the same as the third method. In FIG. 3, shielded wires 74 to 77 are the biased wires, and for example, a select circuit A is surrounded by these shielded wires 74 to 77. The select circuit A provides not only the NAND circuits 19 and 20, and also the inverter circuits 48, 49, and 67. As mentioned above, by that the select circuits are surround with the constant voltage wires, noise generated at the other select circuits is cut off from the select circuit and the bad influence to the select circuit can be reduced. And also, noise generated at the select circuit is cut off from the other select circuits and the bad influence to the other select circuits can be reduced. In this, only four shielded wires 74 to 77 are shown in FIG. 3, however, all wires surrounding the select circuits are shielded wires. The four methods mentioned above are methods to strengthen the resistant characteristic to crosstalk noise.

Furthermore, in order to prevent the duty ratio of signals from deteriorating, as shown in FIG. 2, the inverter circuits 41 to 72 and the NAND circuits 13 to 40 are provided at the embodiment of the present invention. By using these inverting circuits composed of inverter circuits and NAND circuits, a rise signal and a fall signal are transmitted by turns on the signal line, and the rise delay time and the fall delay time are generated in the same degree and are offset. With this, the deterioration of the duty ratio of the signals outputting from the output terminals can be prevented.

Next, referring to FIG. 2, an operation of the present invention is explained. Input signals to be outputted from the output terminals 5 to 8 are decided by that control signals are inputted from the selection control terminals 9 to 12. For example, in case that a signal from the input terminal 1 is transmitted to the output terminal 5, by inputting 1, 0, 0, 0 to the selection control terminals 9-1 to 9-4 respectively, the signal from the input terminal 1 can be transmitted to the output terminal 5. As the same as above, by inputting a control signal to each of the selection control terminals 9 to 12, a signal from an arbitrary input terminal can be transmitted to an arbitrary output terminal.

According to the present invention, signal lines from the input terminals are not disposed in parallel one another in a narrow area. And output signal lines from the select circuits are not disposed in parallel one another in a narrow area. And the signal lines from the input terminals and the output signal lines from the select circuits are not disposed in parallel. Moreover, two kinds of shielded wires are provided. Therefore, noise is prevented from transmitting, and an error operation of the LSI caused by crosstalk noise can be prevented.

Furthermore, the present invention provides inverting circuits composed of inverter circuits and NAND circuits, therefore, the duty ratio of the signals outputting from the output terminals can be prevented from the deterioration. And as shown in FIG. 2, the circuits are disposed regularly, therefore, shortest wiring among circuits can be easily achieved, and an automatic wiring design can be achieved by a CAD system.

While the present invention has been described with reference to the particular illustrative embodiment, it is not to be restricted by that embodiment but only by the appended claims. It is to be appreciated that those skilled in the art can change or modify the embodiment without departing from the scope and spirit of the present invention.

What is claimed is:

1. A signal selection circuit receiving a plurality of input signals and at least one selection signal and providing at least one selected output signal, each said at least one selected output signal being a selected one of said plurality of input signals, said signal selection circuit comprising:
   a plurality of select circuit blocks disposed in a matrix state, each said select circuit block receiving a block input signal and outputting a block output signal, each said select circuit block controlled by one of said at least one selection signal so as either to transmit said block input signal forward as said block output signal or to cut off said block input signal to preclude said input signal from being transmitted forward as said block output signal;
   a plurality of input channels comprising input lines wired in a first direction, for making said plurality of input signals input to said select circuit blocks; and
   at least one output channel wired in a direction crosswise to said input lines, each said at least one output channel providing an output signal to become one of said at least one selected output signal from said signal selection circuit, wherein each said output channel comprises a predetermined plurality of said switching blocks serially interconnected by output lines such that a block output signal of a first select circuit block in said output channel becomes a block input signal of a second select circuit block in said output channel.

2. A signal selection circuit in accordance with claim 1, wherein
   at least one of said input lines and said output lines are disposed between wiring biased by a constant voltage.

3. A signal selection circuit in accordance with claim 1, wherein
   each said select circuit block is surrounded with wiring biased by a constant voltage.

4. A signal selection circuit in accordance with claim 1, wherein
   each said select circuit block comprises at least one inversion function; and
   each said input channel and each said output channel further comprises at least one invertor.

5. A signal selection circuit receiving a plurality of input signals and at least one selection signal and outputting at least one selected signal comprising a selected one of said plurality of received signals, said signal selection circuit comprising:
   a plurality of select circuit blocks disposed in a matrix;
   an input channel for each one of said plurality of input signals, each said input channel comprising at least one section of conductor carrying said one input signal; and
   an output channel for each one of said at least one output selected signal, each said output channel comprising at least one section of conductor carrying said output selected signal, wherein at least two of the following conditions are met:
   said input channel conductors are wired in a first direction and said output channel conductors are wired in a direction crosswise to said input channel conductors;
   said input channel conductors and said output channel conductors are disposed between conductors biased by a constant voltage;
   said plural select circuit blocks are surrounded with conductors biased by a constant voltage; and
   said plural select circuit blocks comprise at least one inversion function and each said input channel and each said output channel respectively further comprises at least one invertor.

6. A signal selection circuit comprising:
   a plurality of input channels, each said input channel receiving an input signal and each said input channel comprised of an input line comprising at least one section of conductor carrying said input signal;
   a plurality of select circuit blocks disposed in a matrix state;
   at least one select signal; and
   at least one output terminal providing an output signal from said signal selection circuit, each said output terminal providing a selected one of said input signals as determined by at least one of said at least one select signal, each said output terminal connected to an output channel, each said output channel comprising an output line comprising at least one section of conductor carrying said selected input signal, wherein at least one of the following conditions is met:
   at least one of said input lines and said output lines are respectively disposed between conductors biased by a constant voltage;
   each said select circuit block is surrounded a conductor biased by a constant voltage; and
   each said plural select circuit block comprises at least one inversion function and each said input channel and each said output channel further comprises at least one invertor.

7. A signal selection circuit having as output at least one selected output signal, wherein said selected output signal is a one signal selected from a plurality of inputted signals, said signal selection circuit comprising:

at least one channel, each said channel comprising a plurality of select circuit blocks interconnected serially such that an output of a first of said select circuit blocks in said channel is interconnected by a section of channel conductor to become an input to a second of said select circuit blocks in said channel, each said channel providing as output a selected one of said plural inputted signals, and each said channel laid out in a first direction; and input lines for making said plural inputted signals input to said plurality of select circuit blocks, wherein said input lines are laid out in a second direction crosswise to said first direction.

8. A signal selection circuit in accordance with claim 7, wherein each said input line comprises a plurality of sections of conductor material interconnected to at least one invertor.

9. A signal selection circuit in accordance with claim 7, further comprising:

shielding conductor material biased by a constant voltage, said conductor material located on both sides of at least one of the following:
each said input line; and
each said channel conductor section in each said channel.

10. A signal selection circuit in accordance with claim 7, further comprising:

shielding conductor material biased by a constant voltage surrounding each said select circuit block.

\* \* \* \* \*